United States Patent [19]

George et al.

[11] Patent Number: 4,980,563

[45] Date of Patent: Dec. 25, 1990

[54] VUV LITHOGRAPHY

[75] Inventors: Edward V. George, Livermore; Yale Oster, Danville; David C. Mundinger, Stockton, all of Calif.

[73] Assignee: United States Department of Energy, Washington, D.C.

[21] Appl. No.: 462,251

[22] Filed: Jan. 9, 1990

[51] Int. Cl.$^5$ ............................................. H01L 21/26
[52] U.S. Cl. ............................. 250/492.2; 250/492.1; 250/492.3; 250/504 R; 313/35; 313/39
[58] Field of Search ............... 250/492.2, 492.1, 493.1, 250/504 R; 313/35, 39

[56] References Cited

U.S. PATENT DOCUMENTS

| | | | |
|---|---|---|---|
| 4,151,008 | 4/1979 | Kirkpatrick | 250/492.2 |
| 4,450,358 | 5/1984 | Reynolds | 250/492.1 |
| 4,498,009 | 2/1985 | Reynolds | 250/492.1 |
| 4,516,253 | 5/1985 | Novak | 250/492.2 |
| 4,526,034 | 7/1985 | Campbell et al. | 250/504 R |

OTHER PUBLICATIONS

"Excited Fluorescence in Solid Nobel Gases Excited by 10–30 kV Electrons" by Ernest E. Huber, Jr. et al., *Optics Communications*, vol. 11, No. 2, Jun. 1974.
"Sustainer Enhancement of the VUV Fluorescence in High-Pressure Xenon" by Ernest E. Huber et al., *IEEE Journal of Quantum Electronics*, vol. QE-12, No. 6, Jun. 1976.
"Radiative and Kinetic Mechanisms in Bound-Free Excimer Lasers", *IEEE Journal of Quantum Electronics*, vol. QE-13, No. 9, Sep. 1977.
"Dynamic Model of High-Pressure Rare-Gas Excimer Lasers" by C. W. Werner et al., *Applied Physics Letters*, vol. 24, No. 4, Aug. 15, 1974.
"Kinetic Model of Ultraviolet Inversions in High-Pressure Rare-Gas Plasmas" by E. V. George et al., *Applied Physics Letters*, vol. 23, No. 3, Aug. 1, 1973.

*Primary Examiner*—Jack I. Berman
*Assistant Examiner*—Kiet T. Nguyen
*Attorney, Agent, or Firm*—Henry P. Sartorio; L. E. Carnahan; William R. Moser

[57] ABSTRACT

Deep UV projection lithography can be performed using an e-beam pumped solid excimer UV source, a mask, and a UV reduction camera. The UV source produces deep UV radiation in the range 1700–1300Å using xenon, krypton or argon; shorter wavelengths of 850–650Å can be obtained using neon or helium. A thin solid layer of the gas is formed on a cryogenically cooled plate and bombarded with an e-beam to cause fluorescence. The UV reduction camera utilizes multilayer mirrors having high reflectivity at the UV wavelength and images the mask onto a resist coated substrate at a preselected demagnification. The mask can be formed integrally with the source as an emitting mask.

18 Claims, 2 Drawing Sheets

VUV LITHOGRAPHY

The U.S. Government has rights to this invention pursuant to Contract No. W-7405-ENG-48 between the U.S. Department of Energy and the University of California, for the operation of Lawrence Livermore National Laboratory.

BACKGROUND OF THE INVENTION

The invention relates generally to submicron lithography and more particularly to deep UV projection lithography, and apparatus for performing same.

There is currently great interest in the development of lithographic techniques for integrated circuit fabrication, particularly for producing submicron line widths. After its initial demonstration in 1972, proximity print x-ray lithography (PPXRL) appeared to be the lithography of choice for future submicron work. PPXRL uses "hard" x-rays (wavelengths of 0.3 to 2 nm) to expose a mask consisting of an x-ray absorber pattern (usually gold or tungsten) on an x-ray transparent membrane (silicon, silicon nitride, boron nitride, etc) at some finite distance (5 to 50 microns) from a resist coated wafer. Unfortunately, PPXRL has several fundamental constraints arising from diffraction effects, penumbra and secondary photoelectron range which may limit replications to linewidths greater than 200 nm. Even with these limitations, it appeared that PPXRL would be the primary lithographic tool for linewidths from 200 nm to 1 micron and would meet lithographic needs for many years to come.

However, PPXRL has not reached expectations. There are three primary reasons for this: (1) a high brightness x-ray source was needed to obtain high wafer throughput, (2) the hard x-rays required masks with thick absorber patterns and high-aspect-ratio submicron structures which are difficult to produce and (3) the thin, x-ray transparent membranes have had severe distortion and lifetime problems. While solutions to these problems were pursued, optical lithography has advanced its capabilities so that it can now replicate 500 nm linewidths. This has reduced the immediate need for PPXRL. With the fundamental resolution limitations of PPXRL and some mask issues still unresolved, it is questionable if PPXRL will ever meet original expectations.

New advances in the field of x-ray optics have been responsible for many new x-ray optical components such as normal incidence soft x-ray mirrors, beamsplitters and highly dispersive multilayer mirrors. These new optical components have made it possible to design and build new instruments such as x-ray microscopes, telescopes, waveguides and interferometers. It is highly desirable to apply these new x-ray optical components to produce a soft x-ray projection lithography (XRPL) system which is capable of projecting a magnified or demagnified image of an existing pattern from a mask onto a resist coated substrate.

U.S. Pat. Application S.N. No. 308,332, filed Feb. 9, 1989, is directed to a soft x-ray reduction camera for submicron lithography for performing soft x-ray projection lithography. A method and apparatus are described for imaging a reflecting, or alternatively a transmissive, x-ray mask onto an integrated circuit wafer using substantially normal incidence x-ray optics. The necessary x-ray optics can be produced using currently available thin-film multilayer technology. Radiation sources in the 2-250 nm range can be utilized.

An x-ray reduction camera is formed of a pair of spherical x-ray mirrors positioned in a spaced apart relationship having a common center of curvature; a camera could also be formed with aspherical mirrors. The convex surface of the shorter radius (primary) mirror and the concave surface of the larger radius (secondary) mirror are coated with periodic multilayers of alternating high index/low index materials, e.g. Cr/C, Mo/Si or B/Ru, to provide high x-ray reflectivity at near normal incidence. A transmissive or reflecting mask is positioned relative to the mirrors so that x-rays incident on the mask are transmitted through or reflected by the mask onto the primary mirror which reflects the x-rays to the secondary mirror which reflects the x-rays to an image plane. A laser generated plasma source or a synchrotron can be used to produce soft x-rays. A condenser system is used to provide uniform illumination of the mask by the source. The transmission mask can be used in an on-axis embodiment in which the mask is aligned on a common axis with the two mirrors, or in an off-axis embodiment which provides higher collection efficiency. A reflection mask off-axis embodiment is preferable since mask requirements are easier, e.g. a patterned multilayer on a thick substrate. The mask substrate is curved to produce a flat image. A resist coated wafer is placed at the image plane so that a reduced image of the mask is transferred thereto.

Using x-ray optical components in accordance with the invention, a soft x-ray reduction camera (XRRC) with 1–10x demagnification and capable of producing sub-100 nm lines can be built. An XRRC has many advantages over a PPXRL system including superior resolution and ease of mask fabrication. In a preferred XRRC design, the x-rays reflect off a mask pattern on a thick substrate rather than transmit through a thin membrane. The mask fabrication technology for the XRRC system has already been demonstrated (the masks are patterned multilayer mirrors). In addition, since the XRRC demagnifies the original mask pattern, optical lithography can be used to generate a mask suitable to produce 100 nm linewidth patterns at the image plane of a 5× reduction system. However, the XRRC requires a soft x-ray source.

In the 1970s considerable work was done on e-beam pumped rare gas excimers. Fluorescers (incoherent radiators) and lasers (coherent radiators) were produced using xenon, krypton, argon, and other gases and mixtures thereof. This work is exemplified by the following papers: Ernest E. Huber, Jr. et al. "Sustainer Enhancement of the VUV Fluorescence in High-Pressure Xenon", *IEEE Journal of Ouantum Electronics*, Vol. QE-12, No. 6, June 1976; Charles W. Werner et al. "Radiative and Kinetic Mechanisms in Bond-Free Excimer Lasers", *IEEE Journal of Ouantum Electronics*, Vol. QE=13, No. 9, Sept. 1977; C.W. Werner et al. "Dynamic Model of High-Pressure Rare-Gas Excimer Lasers", *Applied Physics Letters*, Vol. 25, No. 4, Aug. 15, 1974; E.V. George et al. "Kinetic Model of Ultraviolet Inversions in High-Pressure Rare-Gas Plasmas", *Applied Physics Letters*, Vol. 23, No. 3, Aug. 1, 1973. The work has more recently been extended to e-beam pumped liquids and solids, as shown by Ernest E. Huber, Jr. et al. "Excited Fluorescence In Solid Noble Gases Excited By 10–30 kV Electrons", *Optics Communications*, Vol. 11, No. 2, June 1974. The excimer fluorescers and lasers provide radiation at VUV wavelenghts which extends down and overlaps with the soft x-ray region. Thus incoherent excimer radiators (fluorescers) could be used as sources for submicron lithography.

SUMMARY OF THE INVENTION

Accordingly, it is an object of the invention to provide method and apparatus for performing deep UV projection lithography.

It is also an object of the invention to provide a deep UV system which projects a mask pattern onto a resist coated substrate.

It is another object of the invention to use deep UV for projection lithography.

It is a further object of the invention to provide method and apparatus for performing submicron, and even sub-100 nm, UV lithography.

It is also an object of the invention to provide a deep UV source for projection lithography.

The invention is a method and apparatus for performing VUV lithography using e-beam pumped solid excimers as a source of CW UV light. Fluorescers (incoherent radiators) are used as the source. Rare gases provide UV wavelengths of interest for lithography with xenon producing 1700 A, krypton producing 1500 A and argon producing 1300 A. In addition, other gases can be used to achieve sub-thousand A wavelengths, e.g. neon at 850 A or helium at 650 A. It is desirable to utilize the shortest wavelength possible for the lithographic process.

A thin layer, about 10 microns, of solid argon, krypton or xenon or other suitable gas or mixture is formed on a cold plate or heat exchanger. The cold plate is cryogenically cooled, e.g. maintained at a temperature of about 77° K. (liquid nitrogen) or about 20° K. (gaseous helium refrigeration). The solid argon, krypton or xenon layer is bombarded by an e-beam, typically at 20-100 kV, 1-100 mA. Since the frozen layer is subject to a high heat load, up to 100 W/cm$^2$, the cold plate (heat exchanger) must have a high thermal conductivity and high surface area; these are obtained by making the device of silicon and using microchannels, fins etc. To prevent arcing at the gun, a low chamber pressure of about 10$^{-6}$ torr is necessary; however, if the gun is baffled and differentially pumped, a higher chamber pressure of about 10$^{-3}$ torr is acceptable. CW UV radiation is produced with a high conversion efficiency to UV of about 50 Percent.

A transmission mask can be placed in front of the UV source. Radiation transmitted through the mask is imaged by an x-ray reduction camera which has been designed for the operational deep UV wavelength, typically in the range 1700-1300 A. The camera images the mask onto a substrate.

An alternative called the emitting mask concept to providing a mask in front of the UV source is to build the mask of thermally resistive material, e.g. SiO$_2$, right on the cold plate and coating the entire cold plate and mask with solid argon, krypton or xenon. When the e-beam is incident on the frozen layer, it evaporates the solidified gas over the mask portions while leaving solid material in the gaps between the mask. These regions with the solid material, i.e., solidified gas, emit the short wavelength radiation which is subsequently imaged onto a suitably resist coated wafer using the camera.

DETAILED DESCRIPTION OF THE PREFERRED EMBODIMENTS

The invention is a method and apparatus for producing incoherent deep UV (or VUV) radiation by e-beam pumping solidified gas excimers for UV lithography, and method and apparatus for performing UV lithography using a UV reduction camera with the e-beam pumped solid excimer UV source. Gases which may be used to produce fluorescence radiation at suitable UV wavelengths are shown in Table I. pt,110

These wavelengths approach and overlap into the soft x-ray region. Although it is desirable to ultimately go to the shortest wavelength possible, argon at 1300 A is presently a preferred material for the UV source.

Figure 1:
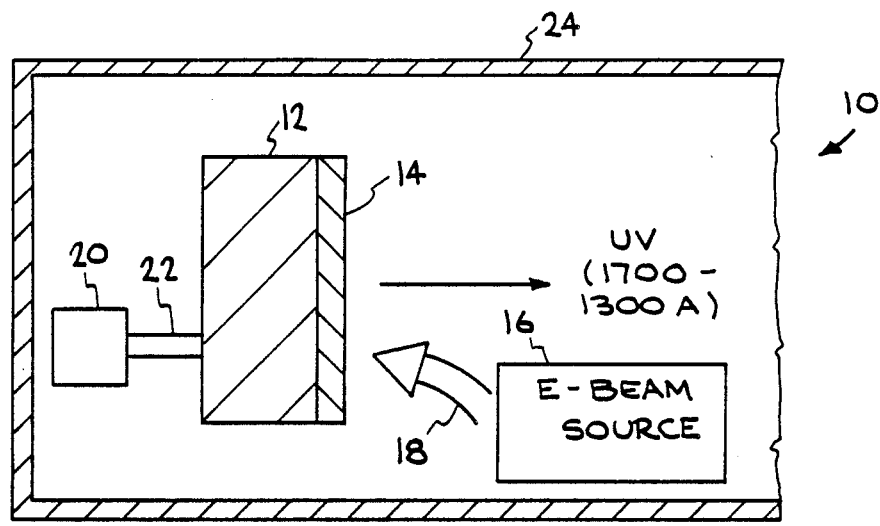
FIG. 1 is a schematic view of a deep UV source for use in lithography.

As shown in FIG. 1, a deep UV source 10 is formed of a cold plate or heat exchanger 12 on which is formed a solid layer 14 of argon, krypton, xenon, or other suitable gas or mixture. Solid layer 14 is typically about 10 microns in thickness. Cold plate 12 is cryogenically cooled to a sufficient temperature to maintain solid layer 14. The temperature will be a function of the material in solid layer 14 and the pressure in the surrounding environment. An electron beam gun 16 produces an electron beam 18 which is directed at the solid layer 14. The electron beam (e-beam) is typically at 20-100 kV, 1-100 mA.

Since the frozen layer 14 is subject to a high heat load from the incident e-beam, from 1W/cm$^2$ up to 100W/cm$^2$, the cold plate (heat exchanger) 12 must have a high thermal conductivity and high surface area. A suitable cold plate can be made of silicon using microchannels, fins, etc. to maximize heat removal ability. Cooling means 20 connected to cold plate 12 by connecting means 22 may be utilized. Liquid nitrogen could be used to maintain a temperature of about 77° K., while gaseous helium refrigeration can be utilized to maintain a temperature of about 20° K.

The UV source is typically contained within an evacuated chamber 24. To prevent arcing at the e-beam gun 16 (between anode and cathode), a low chamber pressure of about 10$^{-6}$ torr is necessary. However, the gun 16 can be baffled and differentially pumped allowing a higher chamber pressure of about 10$^{-3}$ torr. The system, as described, produces incoherent CW UV radiation with a high conversion efficiency to UV of up to about 50 percent; thus the source is a potential good source for lithography.

Figure 2:
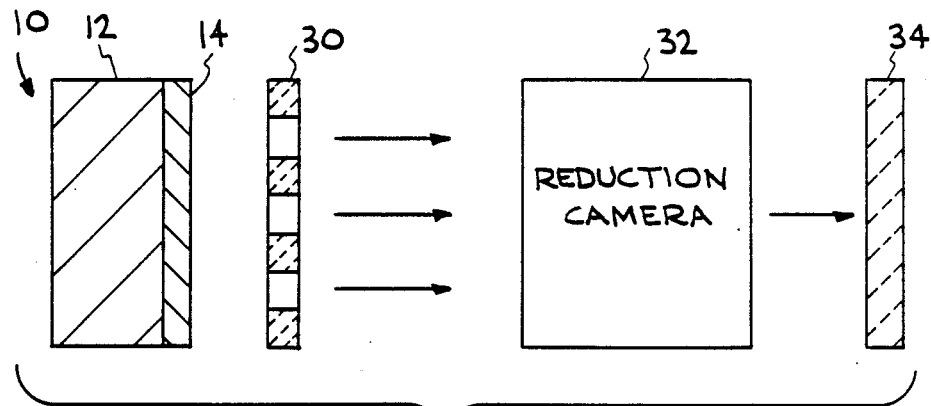
FIG. 2 is a schematic view of a UV lithography system with source, mask, reduction camera and substrate.

As shown in FIG. 2, a transmission mask 30 is placed in front of the UV source 10. UV radiation transmitted through the mask 30 is imaged by a UV reduction camera 32 onto a substrate 34. UV reduction camera 32 is similar to the x-ray reduction camera described in U.S. Pat. Application S.N. No. 308,332, filed Feb. 9, 1989, which is herein incorporated by reference, but the optics have been designed for the operational deep UV wavelength produced by source 10, typically in the range 1700–1300 A for the rare gases xenon, krypton and argon. Substrate 34 may be an integrated circuit wafer. UV reduction camera 32 can be designed with a suitable demagnification so that the lines produced by mask 30 are reduced to the desired submicron level.

Figure 3A:
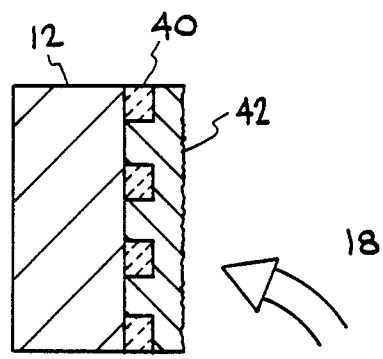
FIGS. 3A-B are schematic views of a UV source having a mask formed in the source.
Figure 3B:
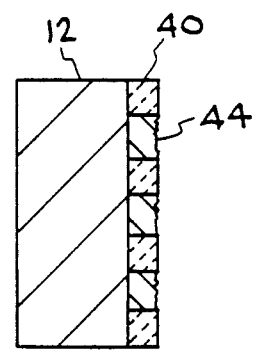

An alternative to providing a mask in front of the UV source, as shown in the system of FIG. 2, is to provide an integral mask in the UV source itself, known as an emitting mask, as shown in FIGS. 3A and B. Mask 40 is formed of a thermally resistive material, e.g. $SiO_2$; mask 40 is formed right on the front surface of cold plate 12. The entire cold plate 12 and mask 40 are then coated with solid argon, krypton or xenon, as previously. When e-beam 18 is incident on the frozen layer 42, it evaporates the solidified gas over the mask portions, while leaving solid material 44 in the gaps between the mask. These regions 44 emit the short wavelength radiation that is imaged with the camera.

Figure 4:
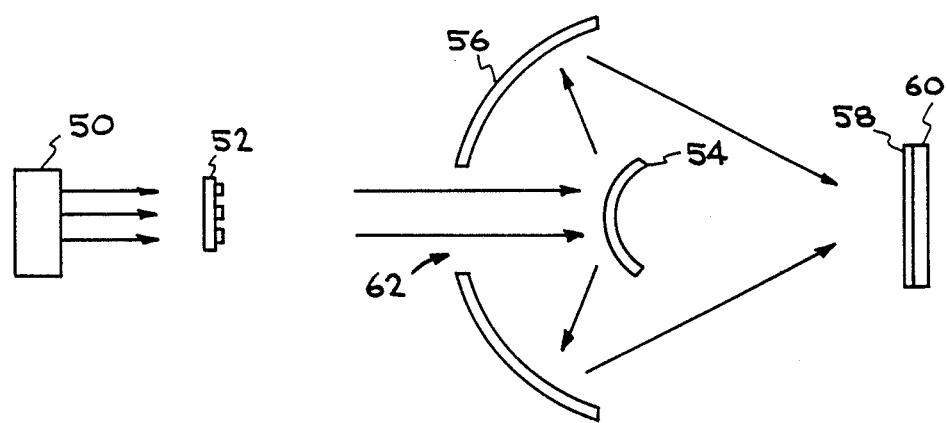
FIG. 4 is a schematic view of the optics in an on-axis imaging system for UV lithography.

An on-axis imaging system for deep UV lithography is shown in FIG. 4. The radiation from UV source 50 is incident substantially normally to and transmitted through mask 52 onto the convex surface of a primary multilayer spherical mirror 54 which reflects the UV light onto the concave surface of a concentric secondary multilayer spherical mirror 56 which reflects the UV radiation to an image plane 58 at which a resist coated wafer 60 is placed. The system is an on axis imaging system; secondary mirror 56 is positioned on the axis between mask 52 and primary mirror 54. Aperture 62 is provided in secondary mirror 56 so that UV radiation transmitted through mask 52 is incident on primary mirror 54. The combination of multilayer mirrors 54, 56, form the UV reduction camera. The reduction camera utilizes normal incidence reflecting spherical, or alternatively aspherical, mirrors for imaging. The multilayer mirrors are designed for high reflectivities, exceeding 50%, at normal incidence for the particular wavelength produced by the UV source.

Figure 5:
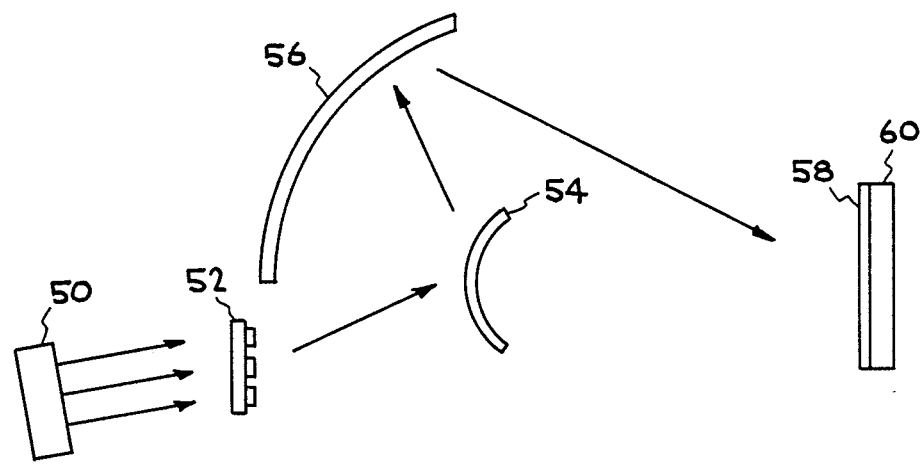
FIG. 5 is a schematic view of the optics for an off-axis imaging system for UV lithography.

An alternate embodiment which eliminates the aperture in the secondary mirror is the off axis imaging system illustrated in FIG. 5. Mask 52 is placed off axis so that secondary mirror 56 does not extend into the path between mask 52 and primary mirror 54. UV radiation from source 50, is incident on mask 52 at an angle so that it is transmitted to primary mirror 54 without having to pass through secondary mirror 56. Mirrors 54, 56 which form the reduction camera are spherical multilayer mirrors, or alternatively aspherical multilayer mirrors, having a common center so that UV radiation from the convex surface of mirror 54 is reflected by the concave surface of mirror 56 to image plane 58 at which resist coated wafer 60 is placed. Various combinations of mirror radii can be used to obtain the desired demagnification factor. The mirrors are formed of alternating layers of high index and low index material deposited on a smooth substrate. The choice of materials is determined by the UV wavelength and the thickness of the individual layers is determined by the wavelength and the angle of incidence between the radiation and the mirror surface. Multilayer mirrors are defined by their "d-spacing" which is the total thickness of two adjacent layers or one period, and by their "γ" which is the ratio of the thickness of the high index material to the period.

Changes and modifications in the specifically described embodiments can be carried out without departing from the scope of the invention which is intended to be limited only by the scope of the appended claims.

We claim:

1. Apparatus for performing deep UV projection lithography comprising:
    a deep UV source comprising:
    a cold plate;
    a cooling means connected to the cold plate for maintaining the cold plate at cryogenic temperature;
    a solid layer of gas which fluoresces at a UV wavelength formed on the cold plate;
    an electron beam gun positioned to bombard the solid layer to cause fluorescence at the UV wavelength;
    a mask positioned after the UV source;
    a UV reduction camera positioned after the source and mask to project an image of the mask onto an image plane.

2. The apparatus of claim 1 wherein the mask is spaced apart from the UV source.

3. The apparatus of claim 1 wherein the mask is integrally formed on a surface of the cold plate.

4. The apparatus of claim 1 wherein the solid layer of gas is selected from argon, krypton, xenon, neon, and helium.

5. The apparatus of claim 1 wherein the UV source is contained in an evacuated chamber.

6. The apparatus of claim 1 wherein the UV reduction camera comprises:
    a primary mirror having a multilayer reflecting convex surface which is highly reflective at the UV wavelength;
    a secondary mirror having a multilayer reflecting concave surface which is highly reflective at the UV wavelength;
    the primary and secondary mirror being optically aligned in a spaced relationship so that UV radiation transmitted through the mask is reflected from the primary mirror to the secondary mirror to the image plane.

7. The apparatus of claim 6 wherein the primary and secondary mirrors are substantially spherical.

8. The apparatus of claim 6 wherein the primary and secondary mirrors are substantially aspherical.

9. The apparatus of claim 1 wherein the UV source produces UV radiation with a wavelength of about 1700 A to 1300 A.

10. The apparatus of claim 1 wherein the solid layer of gas is about 10 microns thick.

11. The apparatus of claim 1 wherein the e-beam gun produces an e-beam of about 20-100 kV and about 1-100 mA.

12. The apparatus of claim 1 wherein the cold plate is formed of silicon.

13. The apparatus of claim 1 wherein the cold plate includes microchannels for cooling.

14. The apparatus of claim 1 wherein the cooling means can remove an incident heat load of up to about 100 W/cm$^2$.

15. Method for performing deep UV projection lithography comprising:
    producing deep UV radiation by bombarding a solid layer of gas which fluoresces at a UV wavelength with an e-beam;
    transmitting the UV radiation through a mask;
    imaging UV radiation transmitted through the mask onto an image plane by means of a UV reduction camera.

16. The method of claim 15 wherein the gas is selected from argon, krypton, xenon, neon and helium.

17. The method of claim 15 further comprising forming the mask integrally with the UV source.

18. An emitting mask for producing UV radiation, comprising:

a cold plate; thermally resistive mask formed on a surface of the cold plate and having gaps therein;

cooling means connected to the cold plate for maintaining the cold plate at cryogenic temperature;

solidified gas which fluoresces at a UV wavelength formed in the gaps in the masks.

* * * * *